United States Patent [19]

Daehler

[11] Patent Number: 4,724,356
[45] Date of Patent: Feb. 9, 1988

[54] INFRARED DISPLAY DEVICE

[75] Inventor: Max Daehler, Belmont, Calif.

[73] Assignee: Lockheed Missiles & Space Co., Inc., Sunnyvale, Calif.

[21] Appl. No.: 917,882

[22] Filed: Oct. 10, 1986

[51] Int. Cl.⁴ .......................... H05B 3/16; B44C 1/22; G01J 1/00; H01J 19/00
[52] U.S. Cl. .................................... 313/522; 313/498; 250/494.1; 250/495.1; 250/504 R; 338/314; 156/628; 156/647; 219/552; 219/553; 357/51
[58] Field of Search .............. 250/493.1, 494.1, 495.1, 250/503.1, 504 R; 219/543, 552, 553; 357/4, 8, 17, 51; 338/308, 309, 314; 156/628, 647

[56] References Cited

U.S. PATENT DOCUMENTS

| | | | |
|---|---|---|---|
| 4,035,607 | 7/1977 | Wu | 219/552 X |
| 4,245,161 | 1/1981 | Crowne | 250/504 R |
| 4,303,931 | 12/1981 | Gaffre | 357/17 |
| 4,378,489 | 3/1983 | Chabinsky et al. | 219/543 |
| 4,389,429 | 6/1983 | Soclof | 156/628 X |
| 4,497,685 | 2/1985 | Soclof | 156/647 |
| 4,644,141 | 2/1987 | Hagen et al. | 219/543 |

Primary Examiner—David K. Moore
Assistant Examiner—Mark R. Powell
Attorney, Agent, or Firm—H. Donald Volk

[57] ABSTRACT

A matrix of infrared generating cells is disclosed. Each cell includes a resistive element formed over and traversing a cavity formed on the surface of the supporting semiconductor substrate.

3 Claims, 8 Drawing Figures

U.S. Patent    Feb. 9, 1988    Sheet 1 of 3    4,724,356
FIG_1
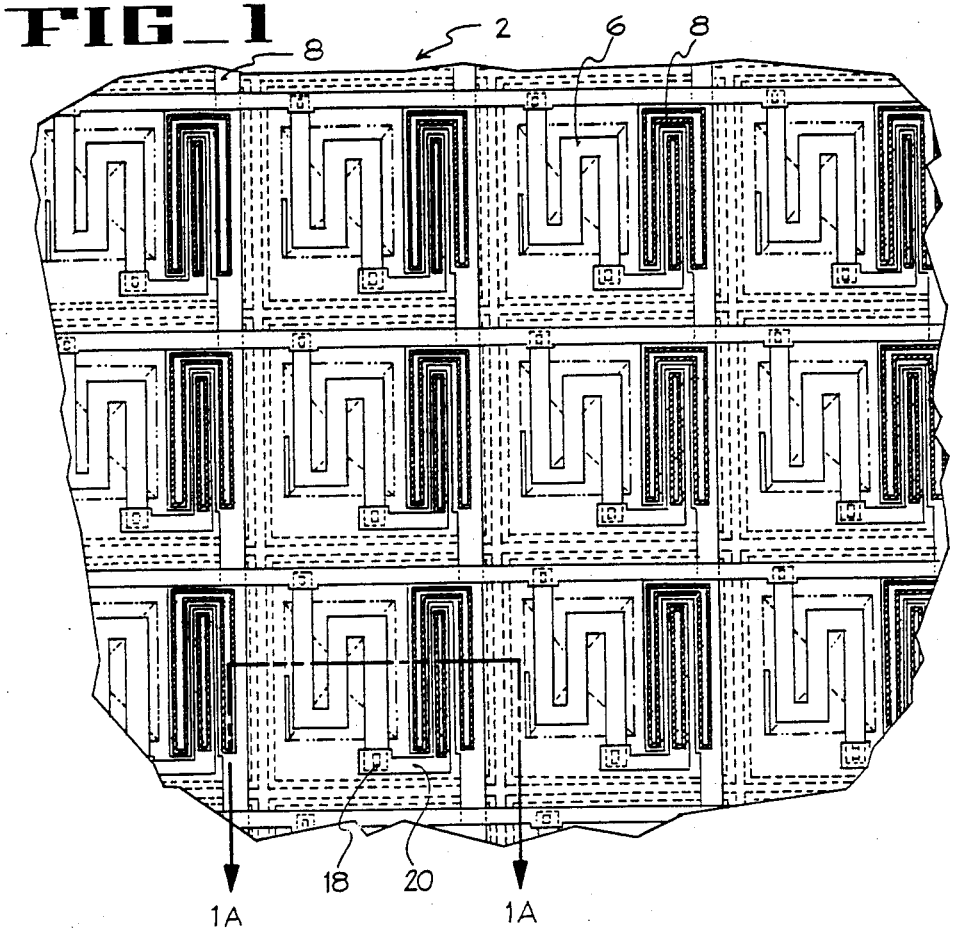
FIG_1A
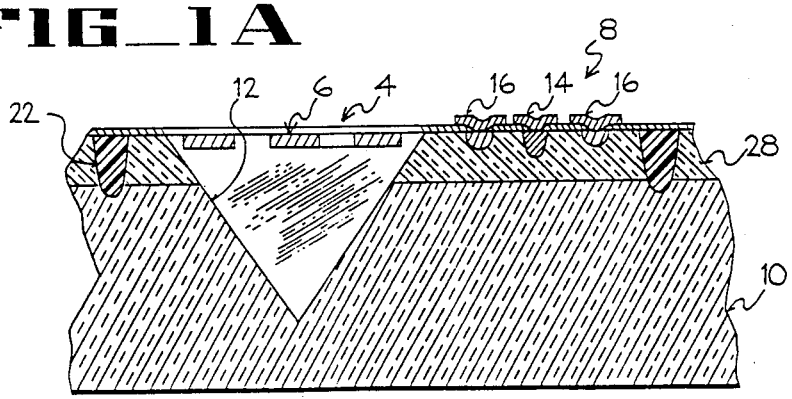

FIG_2
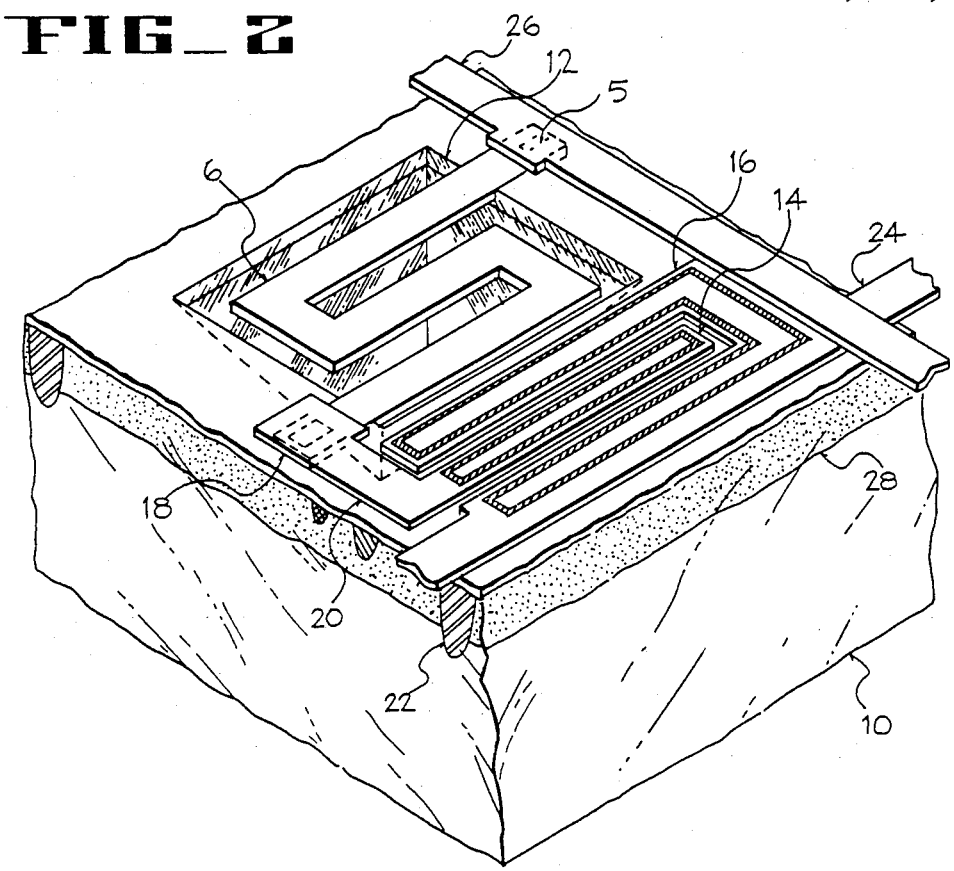
FIG_3
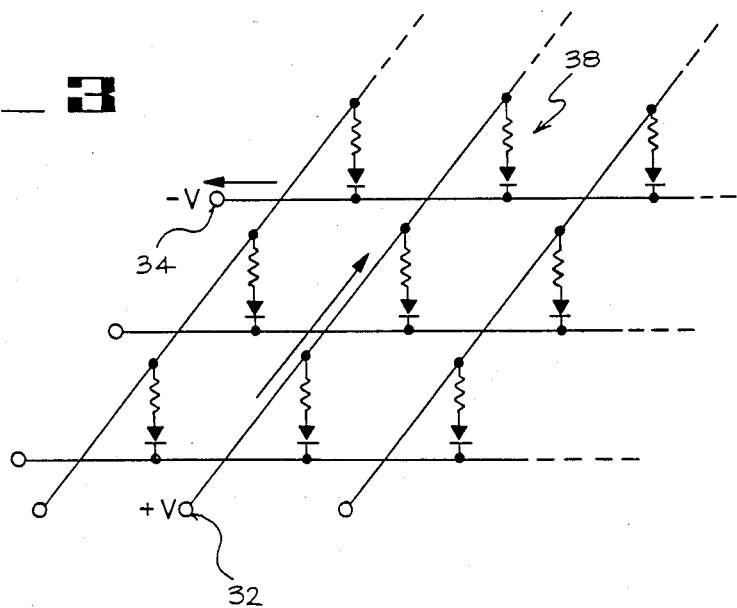

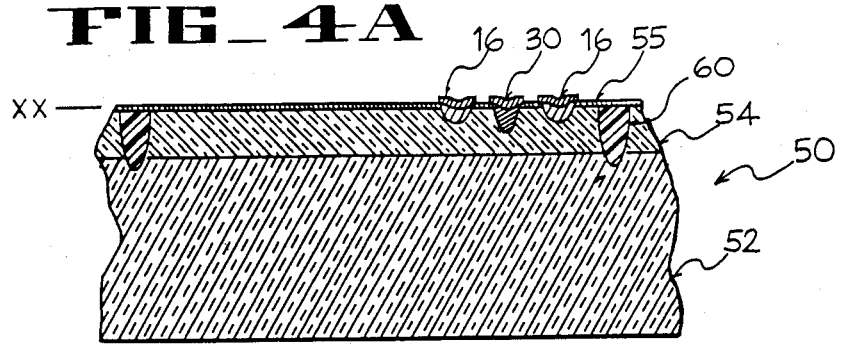
FIG_4A
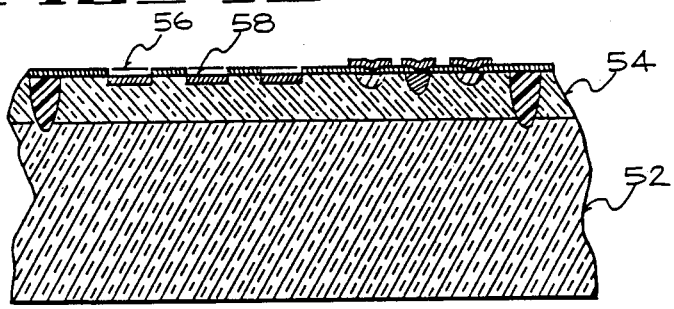
FIG_4B
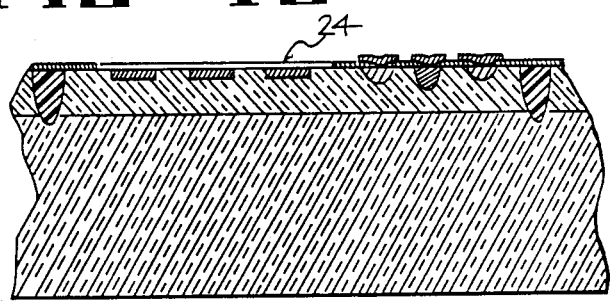
FIG_4C
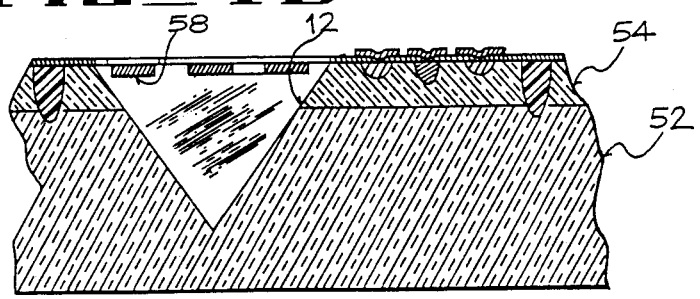
FIG_4D

INFRARED DISPLAY DEVICE

FIELD OF THE INVENTION

The present invention relates to having a plurality of infrared generating cells forming a matrix. Each of the infrared generating cells includes a resistive element formed over and traversing an individual cavity formed on the surface portion of a semiconductor substrate. The resulting infrared generating cells have a low thermal mass and are isolated from each other, resulting in the capability of displaying IR scenes of high contrast and high spatial resolution, with a low power input.

DESCRIPTION OF THE PRIOR ART

With the increased complexity and expense of long wavelength infrared sensors, it is even more important that a means for testing such sensors be provided. The testing environment must include methods for realistically simulating anticipated operational environments during the ground test. Several types of multiple infrared display devices for simulating the anticipated environment exist. However, each of these has severe limitations that restricts its utilization.

A prior art approach to infrared sources utilizes a block of organic one-dimensional metal stressed at the ends and having a potential difference applied across the ends.

One such device is described in U.S. Pat. No. 4,245,161. That patent features a far infrared source made of an organic one-dimensional metal; that material has properties behaving like a metal along one crystal direction only above a certain temperature. Below that temperature, the material develops a gap at the metallic Fermi level which disappears when the crystal is stressed. In the device shown in U.S. Pat. No. 4,245,161, if the device is operated below the critical temperature and pressure is applied near the ends of the member, a potential difference is applied to electrodes situated near the ends.

Such a device is expensive to produce and is hard to operate. Moreover, a plurality of such devices cannot readily be formed into a matrix.

Another approach utilizes a radiator consisting of a thin-film nichrome heating element formed on a base of sapphire material. U.S. Pat. No. 4,378,489 describes a radiator that is interleaved with a resistance thermometer. The radiator and resistance thermometer are fabricated on a sapphire substrate. The sapphire substrate, which has excellent heat conductuity, is thermally isolated from its alumina substrate by epoxy. The sapphire base is further thermally isolated by cutting slots down through the sapphire base and the epoxy to the alumina substrate. Electrical contact is made to the radiator and the resistance thermometer via wire bonds made to gold pads.

The primary disadvantage of such a radiator is that they are expensive to manufacture and they cannot feasibly be formed into a matrix.

Another approach which allows heat sources to be formed in matrix is disclosed in U.S. Pat. No. 4,035,607. That patent features a thermal display comprising an array of semiconductor heater means having a larger cross-sectional area at the display surface than at the support surface. The semiconductor heating elements are formed on a semiconductor substrate and are thermally isolated from each other by insulating material such as epoxy.

Since the elements of such a device are not thermally isolated from each other or the substrate, it would take considerably more power to heat the elements to produce equivalent infrared energy. Also, heat developed in one element is more rapidly transferred to neighboring elements, so that high spatial resolution and high contrast between neighboring elements is difficult to achieve.

BRIEF DESCRIPTION OF THE DRAWINGS

FIG. 1 is a surface view of an array of infrared generating cells.

FIG. 1A is a sectional view taken along line 1A in FIG. 1.

FIG. 2 is an isometric view of a single infrared generating cell.

FIG. 3 is a schematic diagram of an array showing how the cells of the array are connected electrically.

FIGS. 4A-4D illustrate the method of fabricating the array of infrared cells.

DESCRIPTION OF THE PREFERRED EMBODIMENT

Referring now to FIG. 1, a portion of the array 2 of the present invention is shown. The array 2 may be, for example, as large as 128×128 cells. The array 2 is formed of a plurality of infrared generating cells 4. FIG. 1A, which is a sectional view taken along line 1A in FIG. 1, shows a sectional view of a single infrared generating cell 4.

The infrared generating cell 4 includes a resistive element 6 and a diode 8 connected in series.

The resistive element 6 is fabricated on a silicon substrate 10 using mioroelectronic techniques. An inverted pyramid cavity 12 is formed in the silicon substrate 10 and the resistive element 6 traverses the cavity 12.

The diode 8 consists of a strip cathode 14 surrounded by a U-shaped anode 16. The cathode 14 of the diode 8 is connected to one terminal 18 of the resistive element by an elongated conductive strip 20. A rectangular border of boron 22 is diffused around each infrared generating cell 4 to electrically isolate each infrared generating cell from adjacent cells in the array.

As can be seen in FIG. 1 and FIG. 2, the infrared generating cells are interconnected into an array by conductive lattices 24 and 26. Lattice 24 is formed on the surface of the epitaxial layer 28 that has been formed on the silicon substrate 10. Lattice 26 connects the terminals of the resistive elements in a row to each other and to a conventional connecting pad (not shown) on the edge of the array 2. Lattice 24 is also formed on the surface of epitaxial layer and is insulated from lattice 26 at the areas where the two lattices cross. Lattice 24 connects the anode 16 of the diodes in a column to each other and to a conventional connecting pad (not shown) on the edge of the array 2.

A particular infrared generating cell can be actuated by applying a positive electrical pulse to one row 32 of the lattice connected to the terminal of the resistive element in that infrared generating cell while applying a negative electrical pulse to the column 34 of the lattice connected to the anode of the diode in that infrared generating cell. This can be better understood by reference to FIG. 3 which shows selected infrared generating cell 38 being activated by a positive electrical pulse being applied to row 32 of the lattice while applying a negative electrical pulse column 34 of the lattice.

The method of fabricating the device is illustrated in FIGS. 4A–4D.

The process begins with a five centimeter diameter wafer 50 approximately 0.010 inch thick, consisting of a p-type substrate 52 with an n-type epitaxial layer 54 on its surface. The surface of the wafer is oriented in a (100) crystallographic orientation (FIG. 4B).

For clarity, the technique for fabricating the cavity/resistive structure will be described first, in some detail, to be followed by a summary of the steps taken to produce a complete device.

Fabrication of Resistive Element

FIGS. 4A through 4D illustrate the basic method of fabricating the cavity/resistive structure. As shown in FIG. 4A, a silicon dioxide layer 55 approximately 0.5 micrometer thick is deposited on the surface of the epitaxial layer 54 of a silicon substrate 52. A window 56 is then etched in the oxide, the window having the desired dimensions and shape of the resistor element 6 shown in FIG. 2. Boron is then diffused through the window into the silicon, forming a heavily doped (approximately $10^{20}$ atoms per $cm^3$) region 58, approximately 0.5 micrometer in depth and having a surface area in the shape of the resistive element. At this point a cross-section of the wafer appears as in FIG. 4B.

Next the surface is re-oxidized, and a second window 24 is opened in the oxide layer with the shape of a square and with dimensions 0.010 inch on each side (FIG. 4C). The surface exposed by window 24 is then etched with a mixture made of water (400 ml), ethylenediamine (850 ml) and catechol (300 g). This etchant has the anisotropic property that its etch rate in silicon in the (111) crystallographic direction is much lower than in other directions. In the device described here, the result of this etching process is the creation of an upside-down pyramid-shaped cavity 12, whose sides have (111) crystallographic orientations, and whose base, measured on the surface of the substrate, is just the size of the window through which the etchant reaches the substrate.

This etchant has the further property that its etch rate for boron-doped silicon, with boron concentrations greater than approximatey $10^{19}$ atoms per $cm^3$, is very low. Consequently, the etchant does not etch away the boron diffusion areas 58 shown in FIGS. 4B and 4C.

The net effect of the water-ethylene-catechol etch is the removal of silicon to produce a pyramid-shaped cavity 12, with a thin resistive device 58 bridging it at the surface of the silicon substrate, as shown in FIG. 4D. Although the resistive device 58 appears in FIG. 4D to be floating above the cavity 12 without suport, it is actually attached to the silicon substrate at its end points (FIG. 2A).

Fabrication of Infrared Generating Cell

First, the surface of the silicon wafer 52, with its n-type epitaxial layer 54, is cleaned and oxidized.

Rectangular borders having a square grid-like pattern, are opened in the oxide layer using conventional masking and etching techniques. Boron is diffused through the rectangular borders into the surface of the wafer, resulting in isolation junctions 60, having a depth greater than the thickness of the epitaxial layer 54. These isolation junctions 60 surround and electrically isolate each of the infrared generating cells (FIGS. 4A and 4B).

Next the surface of the wafer is re-oxidized, and windows having a U-shaped pattern are etched through the oxidized layer. Boron is diffused through these windows into the wafer's surface, to form the anode 16.

The wafer surface is re-oxidized, and rectangular-shaped windows are etched in the U-shaped areas formed by anodes 16. Phosphorous is deposited and diffused through this window into the surface to form N+regions which form the cathodes 30 of the diodes 8.

The wafer surface is re-oxidized, and windows etched having the shape of the resistive elements shown in FIG. 2. Boron is deposited through these windows and diffused into the surface to form the resistive elements as explained above.

Two aluminum metallization lattices are then laid down, separated by an insulating oxide layer, to provide conventional electrical bonding pads at the periphery of the array, and to provide electrical connections between the infrared generating cells of the array and the conventional bonding pads, not shown, on the edge of the array.

The surface is re-oxidized. Square windows are etched the size of the cavities to be formed; and the device is etched, using the water, ethelene diamine and catechol etchant described above to form the inverted pyramid cavity 12.

Finally, windows are opened having the pattern of the conventional connecting pads to permit electrical connections to these pads.

Other modification and advantageous applications of this invention will be apparent to those having ordinary skill in the art. Therefore, it is intended that the matter contained in the foregoing description and the accompanying drawings is illustrative and not limitative, the scope of the invetnion being defined by the appended claims.

I claim:
1. A display device comprising:
   a semiconductor substrate having a first surface portion having an inverted pyramid cavity formed in said first surface;
   an infrared generating cell comprising a resistive element and a diode;
   said diode is formed on the first surface of said semiconductor substrate adjacent to said inverted pyramid cavity and is connected to said resistive element;
   and wherein said resistive element bridges said inverted pyramid cavity.
2. A display device array comprising:
   a semiconductor substrate having a first surface portion including an array of inverted pyramid cavities formed in said first surface;
   a plurality of infrared generating cells, each infrared generating cell comprising a resistive element and a diode;
   each of said diodes formed on the first surface of said semiconductor substrate adjacent to an inverted pyramid cavity;
   each of said diodes connected to a resistive element;
   each of said resistive elements bridging one of said inverted pyramid cavities.
3. The method of fabricating a display device on a semiconductor, said method comprising the following steps:

coating a silicon dioxide layer on a first surface of said semiconductor;

etching at least one first window in said silicon dioxide layer to outline the desired dimensions and shape of the desired resistive element;

doping the area defined by said window to form a resistive element;

oxidizing said first surface of said semiconductor, including said window;

opening at least one second window in said oxidized layer to outline a square superimposed on said resistive element;

etching the area defined by said second window to form an inverted pyramid-shaped cavity; and, establishing electrical connections to said resistive elements.

* * * * *